(12) United States Patent
Haratsch

(10) Patent No.: US 8,074,157 B2
(45) Date of Patent: Dec. 6, 2011

(54) METHODS AND APPARATUS FOR REDUCED COMPLEXITY SOFT-OUTPUT VITERBI DETECTION

(75) Inventor: Erich F Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 989 days.

(21) Appl. No.: 12/017,547

(22) Filed: Jan. 22, 2008

(65) Prior Publication Data

US 2009/0187813 A1    Jul. 23, 2009

(51) Int. Cl.
*H03M 13/03* (2006.01)

(52) U.S. Cl. ........ 714/795; 714/791; 714/780; 714/786; 714/792; 714/794; 714/796

(58) Field of Classification Search .......... None
See application file for complete search history.

(56) References Cited

U.S. PATENT DOCUMENTS

| | | | | |
|---|---|---|---|---|
| 5,150,369 | A * | 9/1992 | Costa et al. | 714/796 |
| 6,259,749 | B1 * | 7/2001 | Andoh | 375/341 |
| 6,445,755 | B1 * | 9/2002 | Chung et al. | 375/341 |
| 6,680,986 | B1 * | 1/2004 | Hemmati | 375/341 |
| 7,380,199 | B2 | 5/2008 | Haratsch | |
| 2004/0120427 | A1 * | 6/2004 | Lee et al. | 375/341 |
| 2006/0174183 | A1 * | 8/2006 | Ashley et al. | 714/792 |
| 2007/0044008 | A1 * | 2/2007 | Chen et al. | 714/795 |
| 2007/0266303 | A1 * | 11/2007 | Shih | 714/795 |
| 2009/0049367 | A1 * | 2/2009 | Wolf | 714/795 |

OTHER PUBLICATIONS

U.S. Appl. No. 10/853,087, filed May 25, 2004, Ashley et al.
U.S. Appl. No. 10/853,090, filed May 25, 2004, Haratsch.
U.S. Appl. No. 11/045,585, filed Jan. 28, 2005, Ashley et al.
Fettweis et al., "High-Speed Parallel Viterbi Decoding Algorithm and VLSI-Architecture," IEEE Communication Magazine (May 1991).
Hagenauer et al., "A Viterbi Algorithm with Soft-decision Outputs and its Applications," IEEE Global Teleco.
Hekstra, "An Alternative to Metric Rescaling in Viterbi Decoders," IEEE Trans. on Communications, Nov. 1989.

* cited by examiner

*Primary Examiner* — John Trimmings
(74) *Attorney, Agent, or Firm* — Ryan, Mason & Lewis, LLP

(57) ABSTRACT

Methods and apparatus are provided for reduced complexity Soft-Output Viterbi detection. A Soft-Output Viterbi algorithm processes a signal by determining branch metrics using a branch metrics unit; determining survivor paths for sequence detection using a first add-compare select unit; and determining survivor paths for generating one or more bit reliability values using a second add-compare select unit, wherein the first and second add-compare select units process the branch metrics determined by the branch metrics unit. The first and second add-compare select units can optionally process branch metrics having a different number of bits. A sequence detector is provided that comprises a branch metrics unit for determining branch metrics having a first precision; a programmable precision conversion unit for converting the branch metrics having the first precision to branch metrics having a desired precision; and an add-compare select unit for computing path metrics based on the desired precision branch metrics. The Soft-Output Viterbi processor optionally processes a trellis having a reduced number of states relative to a trellis processed by the sequence detector.

20 Claims, 6 Drawing Sheets

FIG. 7

| BIT POSITION | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| FULL PRECISION | | | | | | | | | | | | | | | |
| LOW PRECISION | | | | | | | | | | | | | | | |
| HIGH PRECISION | | | | | | | | | | | | | | | |

METHODS AND APPARATUS FOR REDUCED COMPLEXITY SOFT-OUTPUT VITERBI DETECTION

CROSS-REFERENCE TO RELATED APPLICATIONS

The present application is related to U.S. patent application Ser. No. 11/045,585, entitled "Method and Apparatus for Soft-Output Viterbi Detection Using a Multiple-Step Trellis," filed on Jan. 28, 2005 and incorporated by reference herein.

FIELD OF THE INVENTION

The present invention relates generally to equalization, detection and decoding techniques using the Soft Output Viterbi Algorithm (SOVA).

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well. In read channel chips, a Viterbi detector is typically used to detect the read data bits in the presence of intersymbol interference and noise.

Data detection is often performed using maximum likelihood sequence estimation (MLSE), to produce the output symbols or bits A maximum likelihood sequence estimator considers all possible sequences and determines which sequence was actually transmitted, in a known manner. The Viterbi algorithm is an efficient implementation of MLSE. For a more detailed discussion of a Viterbi implementation of a maximum likelihood sequence estimator, see Gerhard Fettweis and Heinrich Meyr, "High-Speed Parallel Viterbi Decoding Algorithm and VLSI-Architecture," IEEE Communication Magazine (May 1991), incorporated by reference herein. The computation and storage requirements of the Viterbi algorithm are proportional to the number of states and the number of states grows exponentially with the channel memory.

A number of applications require a soft decision, which indicates a reliability value for each detected bit. The Soft Output Viterbi Algorithm (SOVA) is a well known technique for generating soft decisions. The SOVA combines the Viterbi algorithm with additional processing steps to compute soft decisions. These soft decisions can be used by an outer detector to improve the error rate performance of the overall system. For a more detailed discussion of SOVA detectors, see, for example, the above-referenced U.S. patent application Ser. No. 11/045,585 or J. Hagenauer and P. Hoeher, "A Viterbi Algorithm with Soft-decision Outputs and its Applications," IEEE Global Telecommunications Conference (GLOBECOM), vol. 3, 1680-1686 (November 1989). In general, the complexity of a SOVA detector is more complex than a Viterbi detector for the same number of trellis states.

Existing sequence or Viterbi detectors can be replaced by SOVA detectors for the same number of trellis states to provide soft decisions with each detected bit by employing a full-state SOVA detector. The full-state SOVA detector processes the same number of states as the existing sequence detector. It has been found, however, that such an approach requires a prohibitive amount of area and power. For example, if an existing sequence detector processes 32 states, replacing it with a 32-state SOVA sequence detector requires a large amount of chip area and leads to a chip with significant power consumption. Also, such a replacement requires a significant amount of design time. A need therefore exists for soft output Viterbi detection techniques with reduced hardware complexity and reduced design time.

SUMMARY OF THE INVENTION

Generally, methods and apparatus are provided for reduced complexity Soft-Output Viterbi detection. According to one aspect of the invention, a Soft-Output Viterbi algorithm processes a signal by determining branch metrics using a branch metrics unit; determining survivor paths for sequence detection using a first add-compare select unit; and determining survivor paths for generating one or more bit reliability values using a second add-compare select unit, wherein the first and second add-compare select units process the branch metrics determined by the branch metrics unit. The first and second add-compare select units can optionally share a noise-predictive FIR filter.

The first and second add-compare select units can optionally process branch metrics having a different number of bits. For example, the first add-compare select unit can process branch metrics having a reduced number of bits relative to the second add-compare select unit.

According to another aspect of the invention, the branch metrics unit computes full-precision branch metrics and then low-precision branch metrics and/or high-precision branch metrics can be computed that are comprised of a predefined number of bits from the full-precision branch metrics. The precision of the full-precision branch metrics can be altered, for example, by one or more of tapping, saturating, rounding, or truncating the full-precision branch metrics.

According to yet another aspect of the invention, a sequence detector is provided for processing a signal that comprises a branch metrics unit fox determining branch metrics having a first precision; a programmable precision conversion unit for converting the branch metrics having the first precision to branch metrics having a desired precision; and an add-compare select unit for computing path metrics based on the desired precision branch metrics.

In a further aspect of the invention, a Soft-Output Viterbi detector is provided that comprises a sequence detector for determining one or more detected bits; and a Soft-Output Viterbi processor for generating one or more bit reliability values associated with at least one of the one or more detected bits, wherein the Soft-Output Viterbi processor processes a trellis having a reduced number of states relative to a trellis processed by the sequence detector. The bit reliability values comprise, for example, a quality metric indicating a number of times the one or more bit reliability values fall below a threshold.

The sequence detector can process a trellis that includes a parity check code and the Soft-Output Viterbi processor can process a trellis that does not include a parity check code. The Soft-Output Viterbi processor can process the trellis having a reduced number of states relative to the trellis processed by the sequence detector by employing, for example, channel truncation or set partitioning A more complete understanding of the present invention, as well as further features and advantages of the present invention, will be obtained by reference to the following detailed description and drawings.

BRIEF DESCRIPTION OF THE DRAWINGS

FIG. 7 illustrates an exemplary embodiment of the variable precision branch metrics of FIG. 5.

DETAILED DESCRIPTION

The present invention provides soft output Viterbi detection techniques with reduced hardware complexity. According to one aspect of the invention, a SOVA processor is added to a sequence detector, where the SOVA processor processes less trellis states than the sequence detector. According to another aspect of the invention, the sequence detector and the SOVA processor share the same noise predictive FIR filter (if present) or branch metrics unit (or both). The SOVA processor can optionally be turned off in high signal-to-noise ratio (SNR) channels to save power. According to yet another aspect of the invention, the disclosed SOVA processor computes path metrics with higher precision than the sequence detector in order to compute bit reliabilities with high precision.

Figure 1:
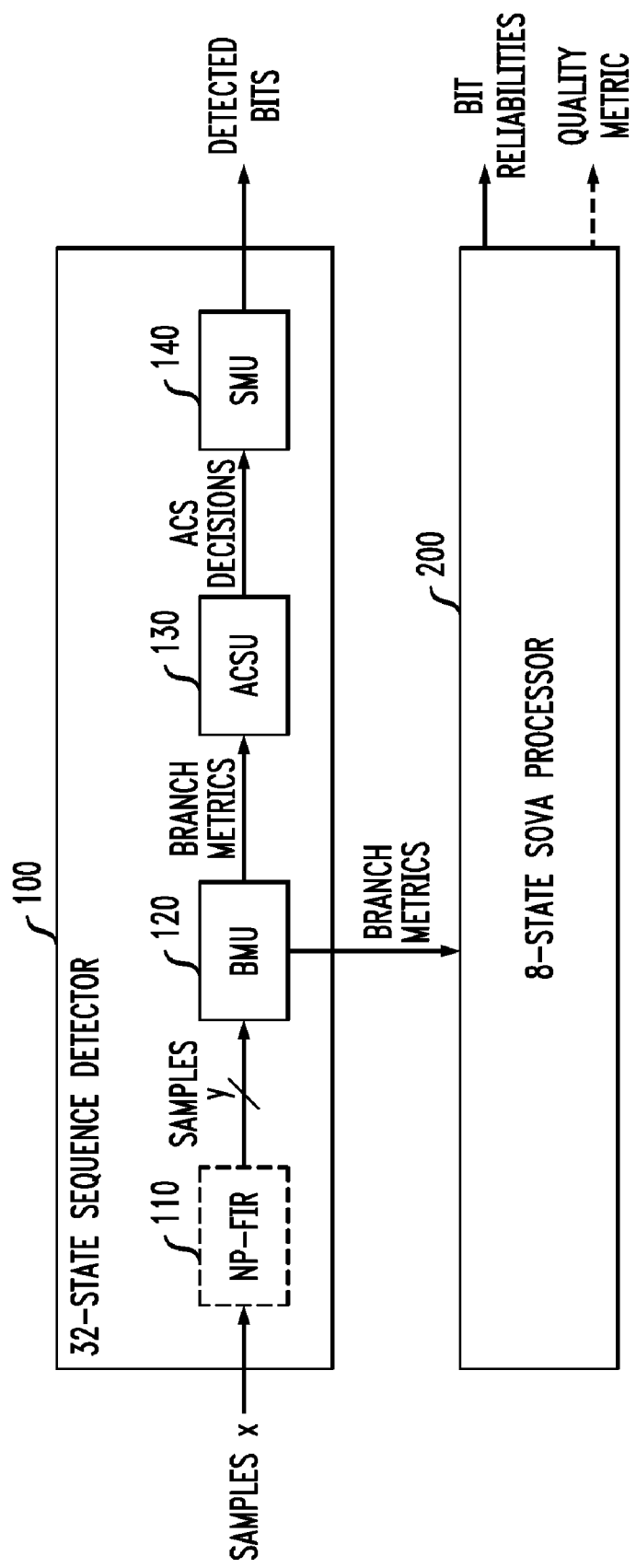
FIG. 1 is a schematic block diagram of a Soft-Output Viterbi detector having a sequence detector and a reduced-state SOVA processor in accordance with an embodiment of the present invention.

FIG. 1 is a schematic block diagram of a Soft-Output Viterbi detector having a sequence detector 100 and a reduced-state SOVA processor 200, in accordance with an embodiment of the present invention. The exemplary sequence detector 100 may be embodied, for example, using the architectures described in U.S. patent application Ser. No. 10/853,087, entitled "Method and Apparatus for Multiple Step Viterbi Detection with Local Feedback," U.S. patent application Ser. No. 10/853,089, entitled "Method and Apparatus For Precomputation and Pipelined Selection of Branch Metrics in a Reduced-State Viterbi Detector," or U.S. patent application Ser. No. 10/853,090, entitled "Method and Apparatus for Reduced-State Viterbi Detection in a Read Channel of a Magnetic Recording System," each filed May 25, 2004 and incorporated by reference herein. The reduced-state SOVA processor 200 is discussed further below in conjunction with FIG. 2.

As shown in FIG. 1, the exemplary sequence detector 100 comprises an optional noise-predictive FIR (NP-FIR) filter 110, a branch metrics unit (BMU) 120, an add-compare-select unit (ACSU) 130 and a survivor memory unit (SMU) 140. Generally, the optional noise-predictive FIR filter 110 would typically be employed for a read channel. For a more detailed discussion of a suitable noise-predictive FIR filter 110, see for example, FIGS. 18 and 19 and the accompanying discussion in U.S. patent application Ser. No. 10/853,089, filed May 25, 2004, entitled "Method and Apparatus For Precomputation and Pipelined Selection of Branch Metrics in a Reduced-State Viterbi Detector," incorporated by reference herein.

The BMU 120 is discussed further below Exemplary embodiments of the ACSU 130 and SMU 140 are described in the above-referenced U.S. patent application Ser. Nos. 10/853,089 or 10/853,087. According to one aspect of the invention, the branch metric unit is shared by the sequence detector 100 and SOVA processor 200, thereby reducing overall chip area. In an implementation employing a noise-predictive FIR filter 110, the NP-FIR filter may also be shared by the sequence detector 100 and SOVA processor 200.

In the exemplary embodiment of FIG. 1, the sequence detector 100 processes a trellis with 32 states, while the SOVA processor 200 processes a trellis with 8 states to reduce the chip area. For example, the trellis employed by the sequence detector 100 may consider 16 states for processing ISI and a 1-bit parity check code, which doubles the number of states (to 32 states). The number of states in the trellis employed by the SOVA processor 200 may be reduced, for example, by excluding the parity check code. In addition, further state reduction can be obtained (for example, down to 8 states) using the reduced state sequence estimation techniques described in the above-referenced U.S. patent application Ser. Nos. 10/853,087, 10/853,089 or 10/853,090.

For example, when a one-bit parity check code is used in the sequence detector trellis, a state $\sigma_n$ in the full-state trellis is given by:

$$\sigma_n = (s_{n-1}; b_{n-1}, b_{n-2}, \ldots, b_{n-L}),$$

where $b_n$ are the state NRZ bits, L is the channel memory and $s_n$ is the running parity syndrome given by the XOR-sum:

$$s_n = b_n \oplus s_{n-1}$$

The total number of states in the full-state trellis that accounts for the parity check code is given by:

$$2 \times 2^L$$

Above equations apply to the magnetic recording read channel and can easily be developed for other communications channels.

In the exemplary embodiment, L=4, which results in 32 trellis states for the sequence detector. A full-state SOVA detector that replaces the sequence detector would have to process 32 states as well. In the exemplary embodiment however, the SOVA processor considers a reduced-state trellis with only 8 states. Thus, the disclosed sequence detector 100/reduced-state SOVA processor 200 combination has reduced complexity when compared to conventional sequence detection techniques with soft outputs that employ a full-state SOVA detector.

Meanwhile, the disclosed techniques still allow existing sequence detector designs to be leveraged. For example, if a sequence detector 100 has been designed with VLSI techniques as a chip macro or chip IP block, the circuitry for the SOVA processor 200 can be added to the sequence detector chip macro. In this manner, design time can be saved, as few, if any, changes are required to an existing sequence detector 100, while the SOVA processor 200 is being added. The SOVA processor 200 can be switched off to save power for channels with high SNR or low bit error rate, or dependent on other conditions.

The sequence detector 100 of FIG. 1 generates the detected bits, in a known manner. As shown in FIG. 1, the reduced-state SOVA processor 200 generates bit reliability values and optionally, a quality metric, in a manner discussed further below in conjunction with FIG. 2.

As indicated above, the branch metrics unit 120 provides calculated branch metrics to both the add-compare-select unit 130 and the reduced-state SOVA processor 200. The reduced-state SOVA processor 200 thus reuses the branch metrics computed by the branch metrics unit 120 of the sequence detector 100 The BMU 120 is explained for an exemplary two-step trellis (not shown) without loss of generality. It is noted that the present invention can be implemented for single or multiple-step trellises, as would be apparent to a person of ordinary skill in the art. For a discussion of single-step or multiple-step trellises, see for example, above-referenced U.S. patent application Ser. Nos. 10/853,087 or 11/045,585.

The BMU 120 computes one-step-trellis branch metrics, m(00000), m(00001), ..., m(11111), as follows:

$$m(b_0 b_{-1} b_{-2} b_{-3} b_{-4}) = [y - e(b_0 b_{-1} b_{-2} b_{-3} b_{-4})]^2,$$

where the subtracted term $e(b_0 b_{-1} b_{-2} b_{-3} b_{-4})$ is the ideal (noise-less) channel output under the condition that the state bit block (on which the ideal output depends) is $b_0 b_{-1} b_{-2} b_{-3} b_{-4}$ In each two-step-trellis clock cycle, each one-step-trellis branch metric is used as a summand in two distinct two-step-trellis branch metrics. The two-step-trellis branch metric for the 6 state bits $b_0 b_{-1} b_{-2} b_{-3} b_{-4} b_{-5}$, where $b_0$ is the most recent bit at the later one-step-trellis period of the two-step-trellis cycle, is given by:

$$m_{branch}(b_0 b_{-1} b_{-2} b_{-3} b_{-4} b_{-5}) = m(b_{-1} b_{-2} b_{-3} b_{-4} b_{-5}) + m(b_0 b_{-1} b_{-2} b_{-3} b_{-4})$$

Figure 2:
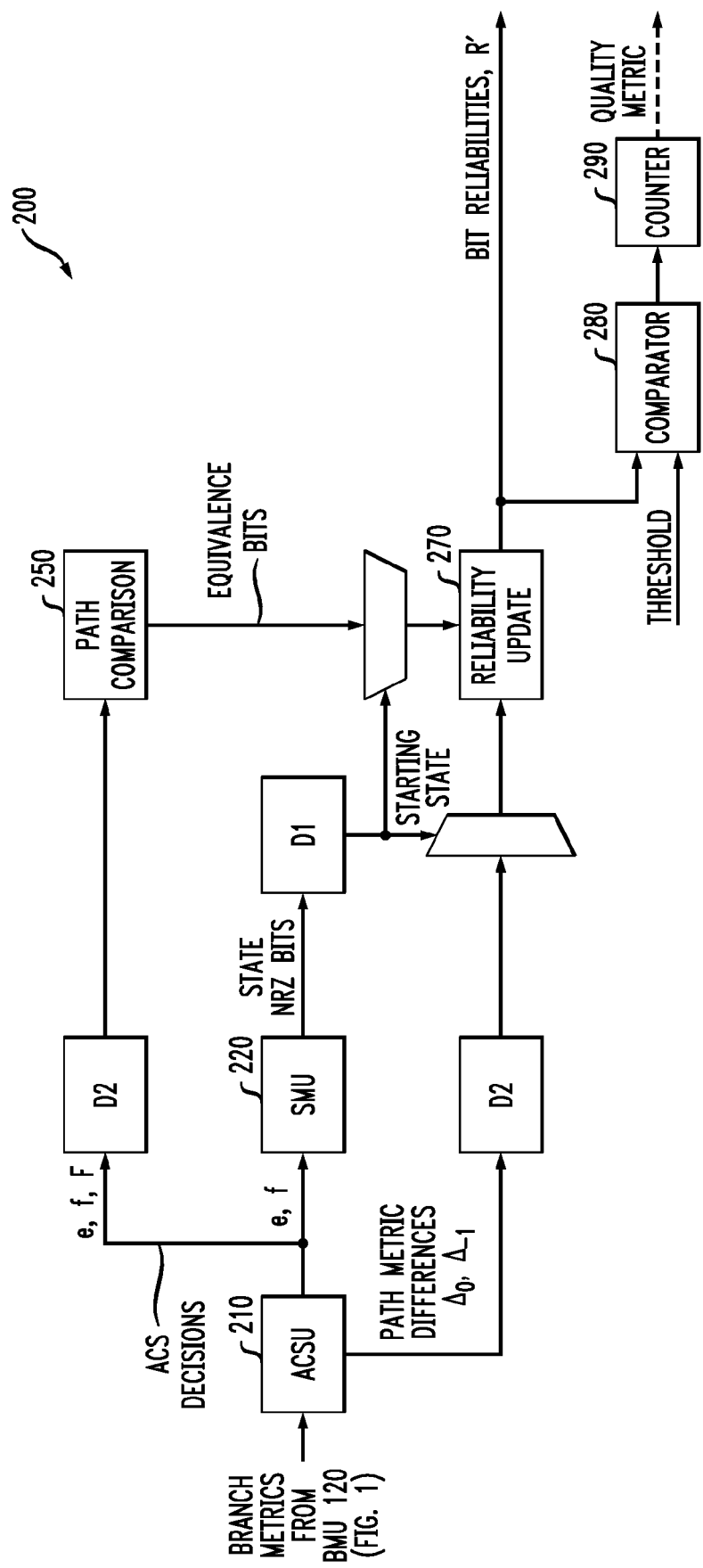
FIG. 2 is a schematic block diagram of an exemplary embodiment of the SOVA processor of FIG. 1 that incorporates features of the present invention.

FIG. 2 is a schematic block diagram of an exemplary embodiment of the SOVA processor 200 of FIG. 1 that incorporates features of the present invention. As shown in FIG. 2, the exemplary SOVA architecture 200 receives the branch metrics from the branch metric unit 120 of FIG. 1. The exemplary SOVA architecture 200 comprises an add-compare-select unit 210, a survivor memory unit 220, a path comparison unit 250, a reliability update unit 270, and a number of delay operators D1-D2. Exemplary embodiments of the SMU 220, path comparison unit 250, and reliability update unit 270 are described in conjunction with FIGS. 11, 12-13, and 14, respectively, of the above-referenced U.S. patent application Ser. No. 11/045,585, entitled "Method and Apparatus for Soft-Output Viterbi Detection Using a Multiple-Step Trellis." An exemplary 8-state trellis for the reduced-state SOVA processor 200 is discussed further below in conjunction with FIG. 3. The computation of path metric differences $\Delta_{-1}$ and $\Delta_0$ in the ACSU 210 is discussed further below in conjunction with FIG. 4.

The BMU 120 (FIG. 1), ACSU 210, and SMU 220 implement the first step of the two-step SOVA, i.e., maximum-likelihood sequence detection using the Viterbi algorithm. The second step of the two-step SOVA is implemented by the path comparison unit 250, which computes the paths that compete with the maximum-likelihood (ML) path, and the reliability update unit 270, which updates the reliabilities for the ML path. For a discussion of the two-step SOVA, see, for example, above-referenced U.S. patent application Ser. No. 11/045,585.

The reliability update unit 270 updates the reliabilities for the ML path in the 8-state trellis. The SOVA processor 200 provides bit reliabilities, R', that are soft outputs. The final bit reliabilities, R', can be provided, for example, to an outer detector for further signal processing to detect or correct errors.

The SOVA processor 200 can optionally compare the final bit reliabilities R' against a programmable threshold PTHRESH using a comparator 280 to provide a quality metric, by performing following operation:

$$R' < PTHRESH$$

A counter 290 counts the number of times the bit reliabilities fall below this threshold. The value in the counter is a quality metric, that is a measure for the quality or SNR of the channel.

Figure 3:
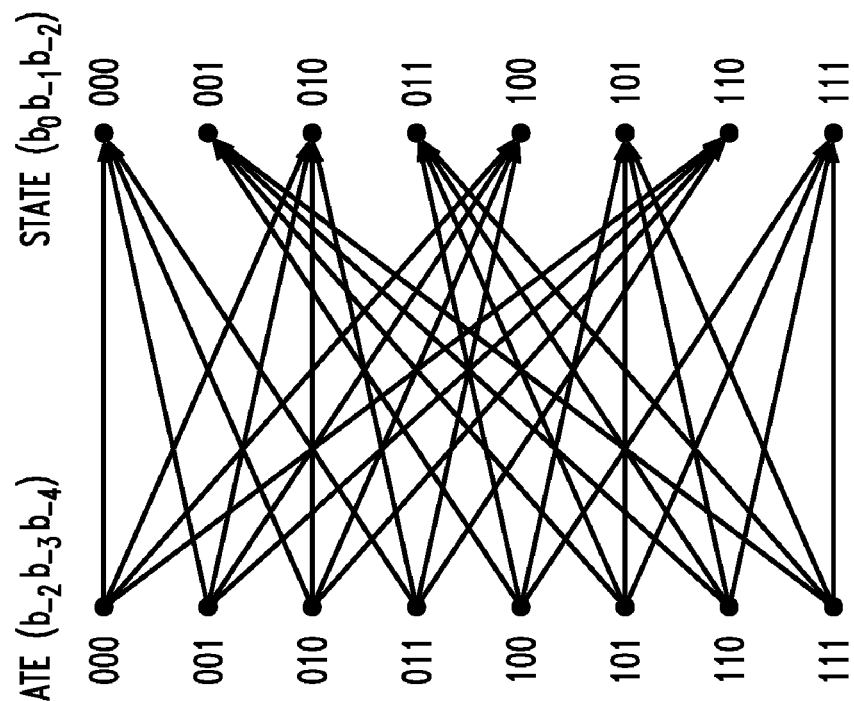
FIG. 3 illustrates a one-step trellis and a two-step trellis processed by the reduced-state SOVA processor of FIG. 2.
Figure 3:
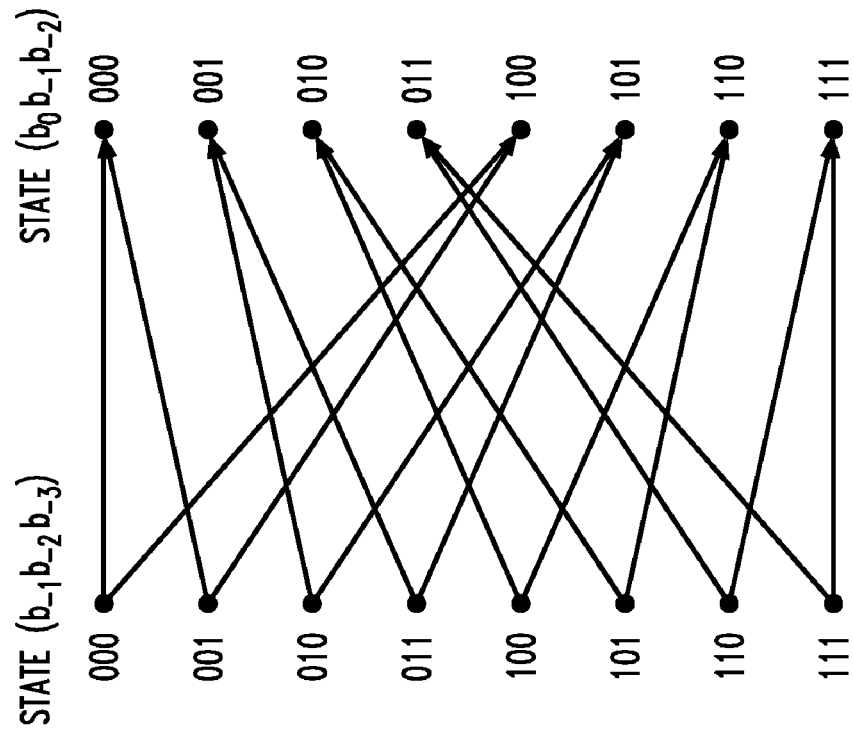

As previously indicated, the exemplary ACSU 210, SMU 200 and path comparison unit 250 process a trellis with a reduced number of states, such as 8 states. The exemplary SOVA processor 200 considers an 8-state trellis, where a state is defined by the 3 state NRZ bits $b_0 b_{-1} b_{-2}$ and denoted by state($b_0 b_{-1} b_{-2}$). FIG. 3 illustrates the one-step trellis 300 and corresponding two-step trellis 350. The bit label $c_0$ for the incoming one-step transition, state($b_{-1} b_{-2} b_{-3}$)→state($b_0 b_{-1} b_{-2}$), is given by:

$$c_0 = \text{label}(b_0 b_{-1} b_{-2}) = b_0$$

The bit labels ($c_0, c_{-1}$) for the incoming two-step transition, state($b_{-2} b_{-3} b_{-4}$)→state($b_0 b_{-1} b_{-2}$), are given by $$(c_0, c_{-1}) = (b_0, b_{-1}).$$

In the exemplary embodiment, the SOVA processer 200 considers the two-step trellis 8-state trellis 350. Compared to the full-state 32-state trellis considered by the sequence detector 100, the number of states was reduced to 8 states by not considering the parity check code, and by considered only the truncated channel memory K=3 instead of the full channel memory L=4 in the state definition. For a discussion of state reduction techniques based on, for example, channel memory truncation and set partitioning, see, for example, U.S. patent application Ser. Nos. 10/853,087, 10/853,089 or 10/853,090.

Reduced State ACSU

Figure 4:
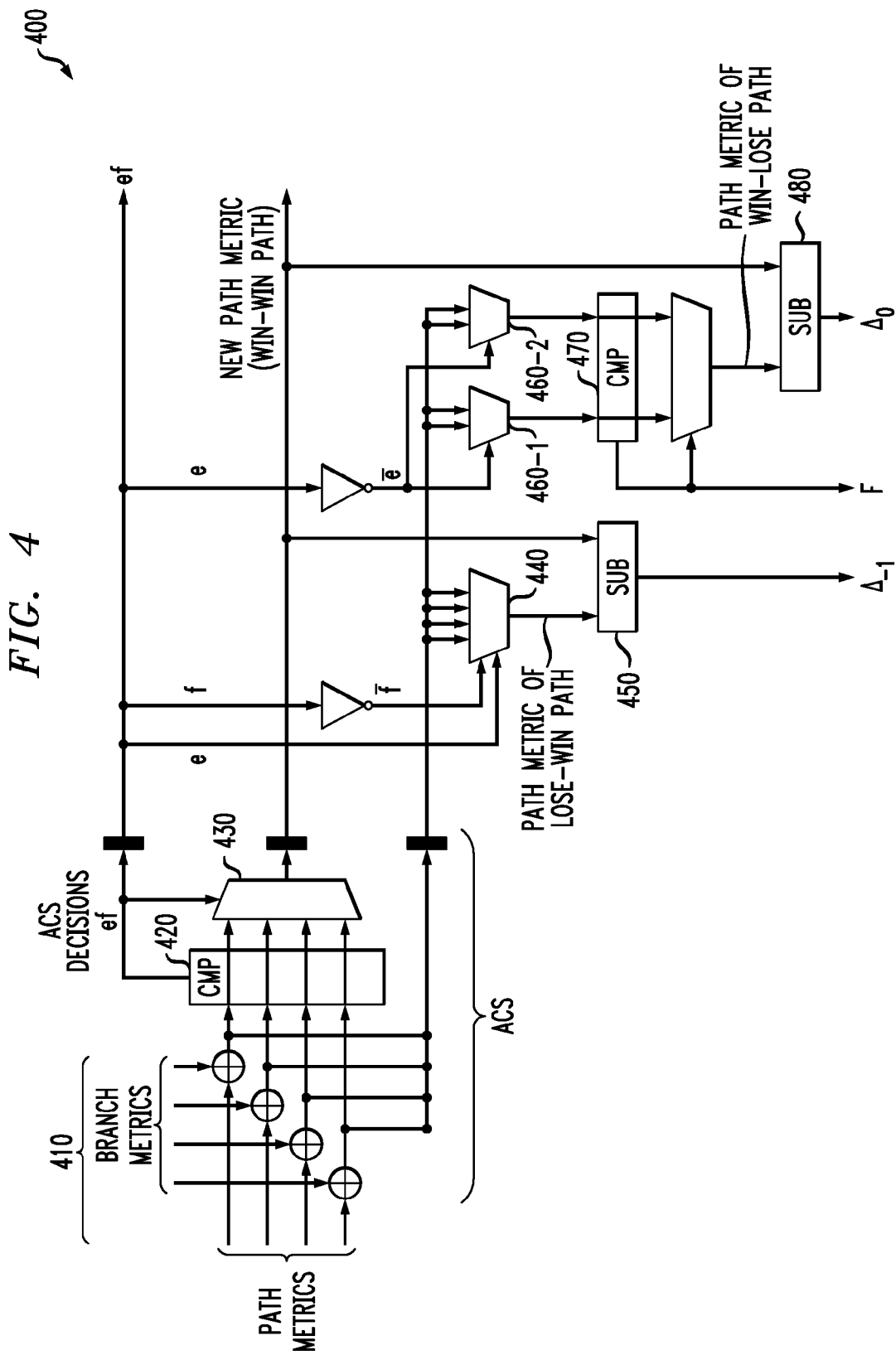
FIG. 4 is a schematic block diagram showing an exemplary implementation of the ACSU of FIG 2.

FIG. 4 is a schematic block diagram showing an exemplary implementation of the ACSU 210 of FIG. 2 and the generation of path metric differences $\Delta_{-1}$ and $\Delta_0$ and the additional ACS decision F. As previously indicated, the ACSU 210 uses the two-step branch metrics, which are computed by the BMU 120 in the sequence detector 100. The ACSU 210 computes path metrics for the winning paths into each state as in a standard Viterbi detector. In addition, the ACSU 210 computes the absolute path metric differences $\Delta_{-1}$ and $\Delta_0$ and an additional selection signal F for each state. As described in the above-referenced U.S. patent application Ser. No. 11/045,585, entitled "Method and Apparatus for Soft-Output Viterbi Detection Using a Multiple-Step Trellis," each path through a trellis can be indentified with a respective two-bit selection signal indicating whether the path wins or loses in each one-step-trellis period of the two-step-trellis cycle into the state. For example, a win-lose path wins (relative to the lose-lose path) in the first period and loses (relative to the win-win path) in the second period of the two-step-trellis cycle.

Two two-step branch metrics $m_{branch}(b_0 b_{-1} b_{-2} b_{-3} b_{-4} b_{-5})$, namely $m_{branch}(b_0 b_{-1} b_{-2} b_{-3} b_{-4} 0)$ and $m_{branch}(b_0 b_{-1} b_{-2} b_{-3} b_{-4} 1)$ qualify for the branch associated with the state transitions:

$$\text{state}(b_{-2} b_{-3} b_{-4}) \to \text{state}(b_0 b_{-1} b_{-2})$$

One out of these two branch metrics can be chosen using local feedback as described in U.S. patent application Ser. Nos. 10/853,087, 10/853,089 or 10/853,090 with a 2-to-1 multiplexer (now shown), which is controlled by the survivor bit $\hat{b}_{-5}$ from the survivor path into state($b_{-2} b_{-3} b_{-4}$). The chosen branch metric is denoted $m'_{branch}(b_0 b_{-1} b_{-2} b_{-3} b_{-4} \hat{b}_{-5})$.

The path metric for the path extension state($b_{-2}b_{-3}b_{-4}$)→state($b_0b_{-1}b_{-2}$) is computed according to:

$$m'_{path}(b_0b_{-1}b_{-2}b_{-3}b_{-4}b_{-5}) = m_{path}(b_{-2}b_{-3}b_{-4}) + m'_{branch}(b_0b_{-1}b_{-2}b_{-3}b_{-4}b_{-5}),$$

where $m_{path}(b_{-2}b_{-3}b_{-4})$ is the path metric for the winning path into state state($b_{-2}b_{-3}b_{-4}$) at the previous two-step clock cycle.

For each state, the ACSU 210 performs the ACS operation to determine the winning path, using a set of adders 410, a comparator 420 and a selector 430. For example, for state (000), the four path metrics for the path extensions into this state are computed as $$m'_{path}(00000\hat{b}_{-5}) = m_{path}(000) + m'_{branch}(00000\hat{b}_{-5})$$

$$m'_{path}(00001\hat{b}_{-5}) = m_{path}(001) + m'_{branch}(00001\hat{b}_{-5})$$

$$m'_{path}(00010\hat{b}_{-5}) = m_{path}(010) + m'_{branch}(00010\hat{b}_{-5})$$

$$m'_{path}(00011\hat{b}_{-5}) = m_{path}(011) + m'_{branch}(00011\hat{b}_{-5})$$

The path metric for the winning path into state($b_0b_{-1}b_{-2}$) is determined with a 4-way comparison 420 among the path metrics for the 4 path extensions into this state, i.e. it is the minimum of the 4 values $m'_{path}(b_0b_{-1}b_{-2}00\hat{b}_{-5})$, $m'_{path}(b_0b_{-1}b_{-2}01\hat{b}_{-5})$, $m'_{path}(b_0b_{-1}b_{-2}10\hat{b}_{-5})$, and $m'_{path}(b_0b_{-1}b_{-2}11\hat{b}_{-5})$.

In the ACSU 210, the path metric differences $\Delta_{-1}$ and $\Delta_0$ are computed after the two-step ACS operation as shown in FIG. 4. The two-bit, two-step ACS selection signal ef is used to select the path metric for the winning path (also known as ML path) as in a conventional two-step ACSU. The path metric of the lose-win path is chosen by a selector 440 using the 2-bit selection signal ef̄. The path metric difference $\Delta_{-1}$ is computed by a subtractor 450 as the difference between the path metric of the lose-win and win-win path. This difference is non-negative, as the path metric of the win-win path is by definition smaller than the path metric of the lose-win path.

The win-lose and lose-lose paths are chosen using two 2-to-1 multiplexers 460-1 and 460-2 based on the select signal ē. This is equivalent to selecting the lose-lose path using two 4-to-1 multiplexers that are driven by the 2-bit select signals ē0 and ē1, respectively. The two selected path metrics are compared by a comparator 470 to identify the win-lose path, and the corresponding select signal F is generated. The path metric difference $\Delta_0$ is computed by subtractor 480 as the difference between the path metric of the win-win and win-lose path. This difference is non-negative, as the path metric of the win-win path is by definition smaller than the path metric of the win-lose path.

Note that inversion of the signals e and f to drive the multiplexers is not necessary if the input lines to the selection multiplexers are reordered.

Increased Precision ACSU for SOVA

The disclosed architecture allows reliabilities to be computed with high precision As used herein, bit reliabilities with "high precision" requires a higher precision for the state metrics in the SOVA processor 200 than normally required in the sequence detector 100. Increasing the precision of the path metrics, however, leads to a longer critical path in the add-compare-select unit 130, and therefore to lower data rates. Thus, according to another aspect of the present invention, high-precision bit reliabilities are generated without sacrificing the data rate of the sequence detector 100.

To generate high-precision soft outputs, the precision of the path metrics in the SOVA processor 200 must be increased. It is desirable, however, to keep the precision of the path metrics as low as possible to achieve high data rates. It has been found that the precision of the path metrics in the SOVA processor 200 need not be increased as much as demanded by the bounds given in Hekstra, "An Alternative to Metric Rescaling in Viterbi Decoders," IEEE Trans. on Communications, November (1989) to achieve good performance.

Figure 5:
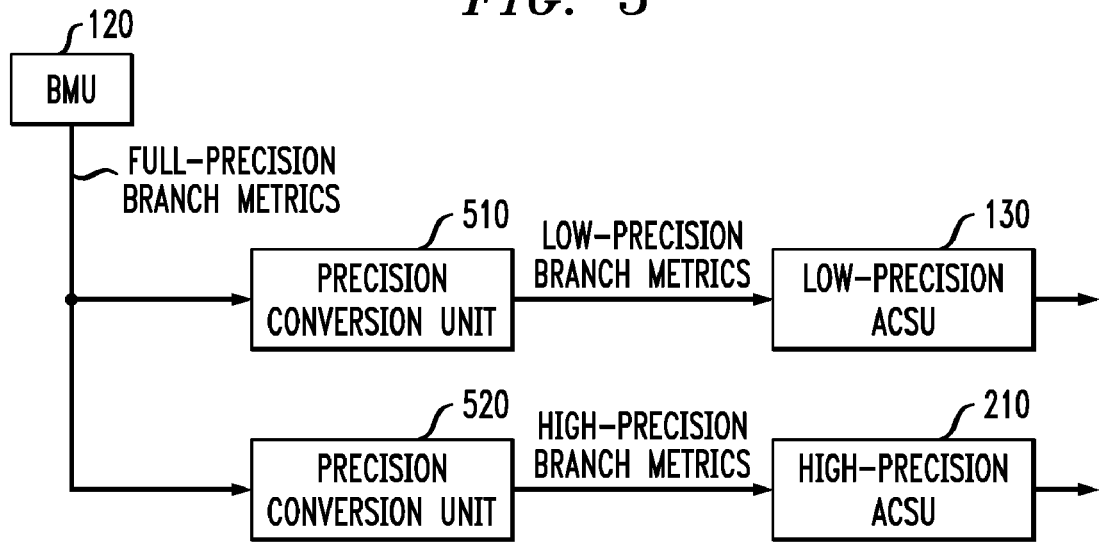
FIG. 5 is a schematic block diagram illustrating an embodiment of the present invention where the ACSU of the sequence detector of FIG. 1 and the ACSU of the reduced-state SOVA processor of FIG. 2 employ different path metric precisions.

FIG. 5 is a schematic block diagram illustrating an embodiment of the present invention where the ACSU 130 of the sequence detector 100 and the ACSU 210 of the reduced-state SOVA processor 200 have different path metric precisions. As shown in FIG. 5, the ACSU 130 of the sequence detector 100 computes low-precision path metrics based on low-precision branch metrics, and the ACSU 210 of the SOVA processor 200 computes high-precision path metrics based on high-precision branch metrics.

As shown in FIG. 5, the BMU 120 of FIG. 1 computes full-precision branch metrics, which are the basis for both the high-precision branch metrics used by the SOVA processor 200 and the low-precision branch metrics used by the sequence detector 100. The low-precision branch metrics can be generated, for example, by a precision conversion unit 510 that saturates, rounds, or truncates the full-precision branch metrics or taps a predefined number of bits of the full-precision branch metrics The high-precision branch metrics can be generated, for example, by a precision conversion unit 520. The high-precision branch metrics can either be equal to the full-precision branch metrics, or obtained, for example, by saturating, rounding, or truncating the full-precision branch metrics or by tapping a predefined number of bits of the full-precision branch metrics. It is noted that the precision conversion units 510, 520 can be distinct circuit elements, as shown in FIG. 5, or the functionality of the precision conversion units 510, 520 can be incorporated into the BMU 120 or the ACSUs 130, 210.

In this manner, high-precision soft outputs can be generated while the path metric precision is increased only modestly in the high-precision ACSU 210, therefore allowing for an implementation with high data rate. Additional circuit and design techniques can be used to speed up the SOVA processor 200, for example, with full-custom design and bit-level pipelining. The maximum data rate of the sequence detector 100 is not sacrificed.

Figure 6:
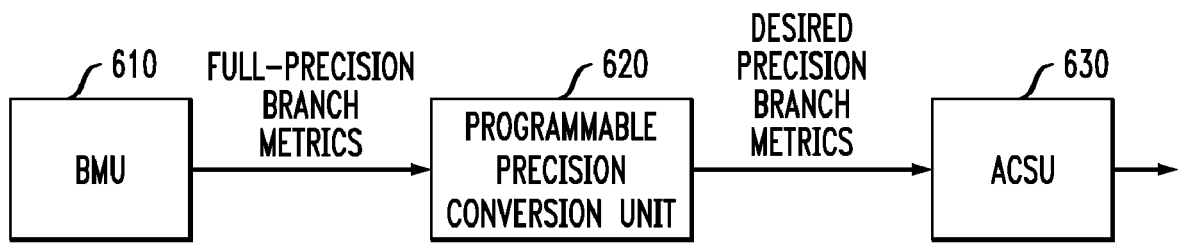
FIG. 6 is a schematic block diagram illustrating an alternate embodiment of the variable precision branch metrics of FIG. 5.

FIG. 6 is a schematic block diagram illustrating an alternate embodiment of the variable precision branch metrics of FIG. 5. While the ACSUs 130, 210 in the embodiment of FIG. 5 share the full-precision branch metrics computed by the BMU 120, the embodiment of FIG. 6 does not require shared branch metrics. As shown in FIG. 6, a BMU 610 generates full-precision branch metrics and a programmable precision conversion unit 620 converts the full-precision branch metrics to generate branch metrics having a desired precision. The programmable precision conversion unit 620, for example, saturates, rounds, or truncates the full-precision branch metrics or taps a predefined number of bits of the full-precision branch metrics. An ACSU 630 computes path metrics based on the desired precision branch metrics. The ACSU 630 can be part of the sequence detector 100 of FIG. 1, the reduced-state SOVA processor 200 of FIG. 2 or both. In general, the programmable precision conversion unit 620 can be programmed to include a desired number and range of bits in the desired precision branch metrics. The programmable precision conversion unit 620 can be built such that it is programmable by the user of the product, or it can be built such that it is adaptive and automatically programmed dependent on the channel or operating conditions such as the SNR or noise environment. In an exemplary embodiment, the programmable precision conversion unit 620 would for example tap the 6 most significant bits (MSBs) of a full-precision branch metric with 8 bits in one operating condition, and tap and saturate the 6 least significant bits (LSBs) in another operating condition FIG. 7 illustrates an exemplary embodiment of the variable precision branch metrics of FIG. 5. As shown in FIG. 7, the BMU 120 generates full-precision branch metrics comprised of 15 bits. In addition, the exemplary precision conversion unit 510 generates low-precision branch metrics comprised of the eight most significant bits (MSBs) of the full-precision branch metrics. In addition, the exemplary precision conversion unit 520 generates high-precision branch metrics comprised of the ten least significant bits (LSBs) of the full-precision branch metrics. As indicated above, the precision conversion units 510, 520 can, for example, tap, saturate, round, or truncate the full-precision branch metrics to generate the low or high precision branch metrics.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A Soft-Output Viterbi algorithm for processing a signal, comprising the steps of:
   determining branch metrics using a branch metrics unit;
   determining survivor paths for sequence detection using a first add-compare select unit; and
   determining survivor paths for generating one or more bit reliability values using a second add-compare select unit, wherein said first and second add-compare select units process said branch metrics determined by said branch metrics unit.

2. The Soft-Output Viterbi algorithm of claim 1, wherein said step of determining survivor paths for generating said one or more bit reliability values using said second add-compare select unit further comprises the step of employing local feedback to select said branch metrics.

3. The Soft-Output Viterbi algorithm of claim 1, wherein said step of determining survivor paths for generating said one or more bit reliability values using said second add-compare select unit is suspended when one or more of a signal-to-noise ratio and operating conditions on a channel exceed a predefined threshold.

4. The Soft-Output Viterbi algorithm of claim 1, wherein said branch metrics unit computes full-precision branch metrics.

5. The Soft-Output Viterbi algorithm of claim 4, further comprising the step of computing low-precision branch metrics comprised of a predefined number of bits from said full-precision branch metrics.

6. The Soft-Output Viterbi algorithm of claim 4, further comprising the step of computing high-precision branch metrics comprised of a predefined number of bits from said full-precision branch metrics.

7. The Soft-Output Viterbi algorithm of claim 4, further comprising the step of altering a precision of said full-precision branch metrics by one or more of tapping, saturating, rounding, or truncating said full-precision branch metrics.

8. The Soft-Output Viterbi algorithm of claim 1, wherein said first and second add-compare select units process branch metrics having a different number of bits.

9. The Soft-Output Viterbi algorithm of claim 8, wherein said first add-compare select unit processes branch metrics having a reduced number of bits relative to said second add-compare select unit.

10. The Soft-Output Viterbi algorithm of claim 1, wherein said one or more bit reliability values are used to compute a quality metric indicating a number of times said one or more bit reliability values fall below a threshold.

11. The Soft-Output Viterbi algorithm of claim 1, wherein said first and second add-compare select units share a noise-predictive FIR filter.

12. A sequence detector for processing a signal, comprising:
   a branch metrics unit for determining branch metrics having a first precision;
   a programmable precision conversion unit for converting said branch metrics having said first precision to branch metrics having a desired precision; and
   an add-compare select unit for computing path metrics based on said desired precision branch metrics.

13. The sequence detector of claim 12, wherein said programmable precision conversion unit alters a precision of said branch metrics having a first precision by one or more of tapping, saturating, rounding, or truncating said first precision branch metrics.

14. A Soft-Output Viterbi detector for processing a signal, comprising:
   a sequence detector for determining one or more detected bits; and
   a Soft-Output Viterbi processor for generating one or more bit reliability values associated with at least one of said one or more detected bits, wherein said Soft-Output Viterbi processor processes a trellis having a reduced number of states relative to a trellis processed by said sequence detector.

15. The Soft-Output Viterbi detector of claim 14, wherein said one or more bit reliability values comprise a quality metric indicating a number of times said one or more bit reliability values fall below a threshold.

16. The Soft-Output Viterbi detector of claim 14, wherein said sequence detector processes a trellis that includes a parity check code and said Soft-Output Viterbi processor processes a trellis that does not include a parity check code.

17. The Soft-Output Viterbi detector of claim 14, wherein said Soft-Output Viterbi processor processes said trellis having a reduced number of states relative to said trellis processed by said sequence detector by employing channel truncation.

18. The Soft-Output Viterbi detector of claim 14, wherein said Soft-Output Viterbi processor processes said trellis having a reduced number of states relative to said trellis processed by said sequence detector by employing set partitioning.

19. The Soft-Output Viterbi detector of claim 14, wherein said Soft-Output Viterbi processor employs local feedback to select branch metrics.

20. The Soft-Output Viterbi detector of claim 14, wherein said Soft-Output Viterbi processor is suspended when one or more of a signal-to-noise ratio and operating conditions on a channel exceed a predefined threshold.

* * * * *